(12) United States Patent
Van der Meulen

(10) Patent No.: US 6,906,617 B1
(45) Date of Patent: Jun. 14, 2005

(54) INTELLIGENT APPLIANCE HOME NETWORK

(75) Inventor: Pieter Sierd Van der Meulen, Sunnyvale, CA (US)

(73) Assignee: Koninklijke Philips Electronics N.V., Eindhoven (NL)

( * ) Notice: Subject to any disclaimer, the term of this patent is extended or adjusted under 35 U.S.C. 154(b) by 542 days.

(21) Appl. No.: 09/715,364

(22) Filed: Nov. 17, 2000

(51) Int. Cl.$^7$ .............................................. H04H 11/04
(52) U.S. Cl. ..................... 340/310.01; 340/310.08; 340/825.06; 340/825.02; 340/825.22; 340/825.23; 340/3.31; 340/3.32; 340/3.1; 340/679; 340/664; 340/661; 340/654; 340/637; 340/635
(58) Field of Search ............... 340/310.07, 310.08, 340/825.06, 870.02, 635, 637, 654, 661, 664, 679, 3.1, 3.31, 3.32, 825.22, 825.23; 700/296, 297, 291, 306

(56) References Cited

U.S. PATENT DOCUMENTS

| | | | | |
|---|---|---|---|---|
| 4,716,409 A | * | 12/1987 | Hart et al. ............. | 340/825.22 |
| 5,229,753 A | * | 7/1993 | Berg et al. .................. | 340/679 |
| 5,233,342 A | * | 8/1993 | Yashiro et al. ................ | 340/3.7 |
| 5,268,666 A | * | 12/1993 | Michel et al. ......... | 340/310.06 |
| 5,428,342 A | * | 6/1995 | Enoki et al. ................ | 340/511 |
| 5,600,310 A | * | 2/1997 | Whipple et al. ............ | 340/3.51 |
| 5,650,771 A | * | 7/1997 | Lee ............................. | 340/656 |
| 5,699,276 A | * | 12/1997 | Roos ...................... | 379/106.03 |
| 5,880,677 A | * | 3/1999 | Lestician ..................... | 340/3.1 |
| 6,147,484 A | * | 11/2000 | Smith .......................... | 324/142 |
| 6,420,969 B1 | * | 7/2002 | Campbell ................... | 340/506 |

FOREIGN PATENT DOCUMENTS

| | | |
|---|---|---|
| WO | WO9637992 | 11/1996 |
| WO | WO9849824 | 11/1998 |

* cited by examiner

Primary Examiner—Daniel J. Wu
Assistant Examiner—Tai T. Nguyen
(74) Attorney, Agent, or Firm—Kevin Simons

(57) ABSTRACT

The instantaneous power consumption of an appliance is used to determine the status of the appliance, from which further actions may be taken. This invention is premised on the observation that most appliances have a characteristic power consumption pattern that can be used to determine the state of operation of the appliance. An electric coffee pot, for example, consumes high power substantially continuously during the brewing state, then reduces its power level, or power duration, or both, while keeping the pot warm, then terminates its power consumption when it is turned off. In like manner, the power consumption patterns of other appliances, such as toasters, washing machines, dryers, and so on may also be used to determine the state of each appliance. The communicated state may be used by a home-automation system to effect a variety of actions, including notifying the user, terminating the available power to the appliance, initiating an action by another appliance, and so on.

23 Claims, 5 Drawing Sheets

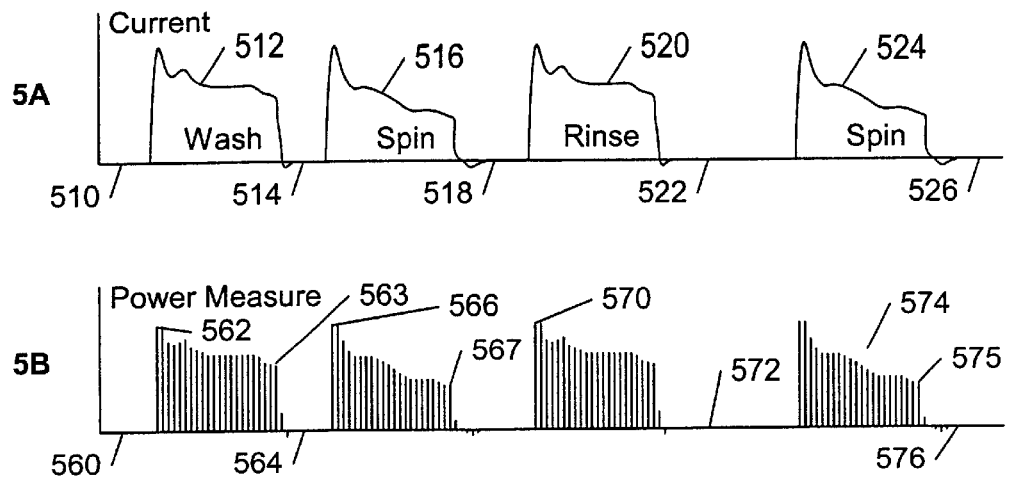
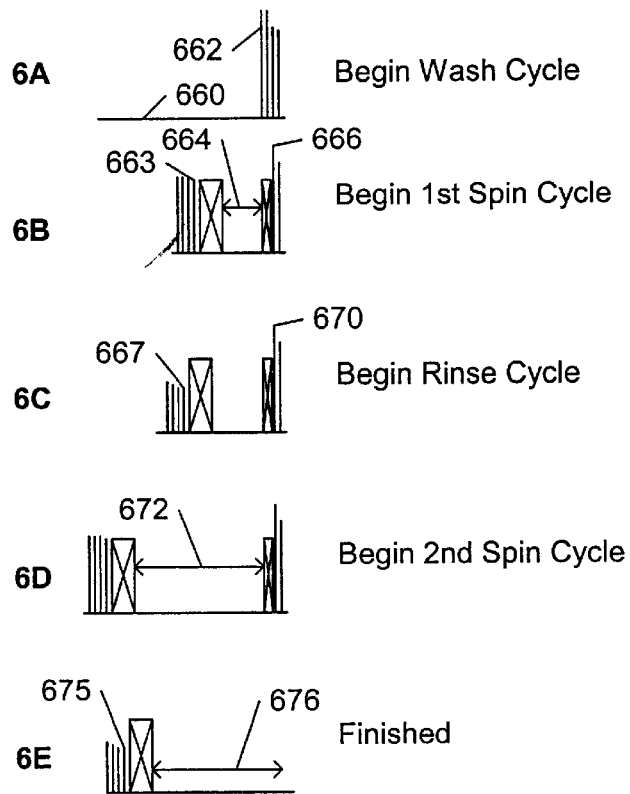
FIG. 5
FIG. 6

INTELLIGENT APPLIANCE HOME NETWORK

BACKGROUND OF THE INVENTION

1. Field of the Invention

This invention relates to the field of consumer devices, and in particular to the field of automated home control systems.

2. Description of Related Art

Home automation is becoming increasingly popular. Standards continue to be developed which will allow devices of varying types and varying vendors to be controlled by a common controller. Such standards include IEEE 1394, X-10, HAVi, HomeAPI, Jini, and the like. IEEE 1394 and X-10 are communication protocols; HAVi is a software architecture using IEEE 1394; Home API is an open industry specification that defines a standard set of software services and application programming interfaces which enable software applications to monitor and control home device. Jini is a distributed software architecture (network) wherein clients see devices and services as objects.

Some home automation systems may include a monitoring and reporting system that maintains a record of selected events. For example, U.S. Pat. No. 4,644,320, "HOME ENERGY MONITORING AND CONTROL SYSTEM", issued Feb. 17, 1987 for Carr et al, incorporated by reference herein, presents a system that periodically records the temperature inside and outside the home, and a cumulative energy usage, measured via energy measuring devices that are attached to appliances such as furnaces, air conditioners, and the like. Statistics are also provided and presented as text or graphic displays to facilitate a user's assessment of the energy usage, and potentially effect a change of habit to reduce such usage.

Typical home automation systems are configured to provide a central control station and a number of remote controllers. For example, the central control station may be a home computer, and the remote controllers may be sub-controllers located in particular areas of the home, such as in a master bedroom, entry foyer, and the like. Typical home automation systems may also include remote sensors that are used, for example, to automatically turn lights on or off when motion is detected, or to turn a television set on or off in response to a particular sound or voice command. Some home automation systems allow the desired operations to be preprogrammed, so that, for example, lights or appliances are turned on or off at different preset times, televisions are tuned to different channels at different times, and so on.

As detailed above, most home automation systems are fundamentally "unidirectional": information flows from the user to the appliance. The user provides commands to appliances, either directly or indirectly, and the appliance is controlled to effect the command. Some appliances are available that contain a degree of "intelligence" to effect a "bidirectional" information flow by communicating information to the user regarding their status, available options, and so on. Such a bidirectional information flow capability, however, is typically available only from fairly sophisticated appliances, such as home-entertainment systems, wherein the additional cost associated with providing the "intelligence" required is insubstantial, or deemed to be worthwhile to effect a product differentiation. Also, even if a majority of future appliances contain sufficient intelligence to communicate their status to a home automation system, the cost of replacing every legacy appliance in one's home to obtain such intelligent appliances will be cost-prohibitive to most users.

BRIEF SUMMARY OF THE INVENTION

It is an object of this inventing to provide a method for communicating a status of an appliance that is easy to implement regardless of the capabilities of the appliance. It is a further object of this invention to provide a method for communicating a status of an appliance without requiring a modification to the appliance. It is a further object of this invention to provide an appliance-independent device that can provide status information that can be used to determine the status of its associated appliance. It is a further object of this invention to provide a method and device to enhance the physical security of the appliances in a home-automation system.

These objects and others are achieved by monitoring the instantaneous power consumption of an appliance to determine the status of the appliance. This invention is premised on the observation that most appliances have a characteristic power consumption pattern that can be used to determine the state of operation of the appliance. An electric coffee pot, for example, consumes high power substantially continuously during the brewing state, then reduces its power level, or power duration, or both, while keeping the pot warm, then terminates its power consumption when it is turned off. Additionally, distinctive power consumption patterns may be associated with, for example, the repeated heating of an empty or near empty coffee pot, the absence of the coffee pot, and so on. In like manner, the power consumption patterns of other appliances, such as toasters, washing machines, dryers, and so on may also be used to determine the state of each appliance. The communicated state may be used by the home-automation system to effect a variety of actions, including notifying the user, terminating the available power to the appliance, initiating an action by another appliance, and so on.

BRIEF DESCRIPTION OF THE DRAWINGS

The invention is explained in further detail, and by way of example, with reference to the accompanying drawings wherein:

FIG. 5 illustrates an example timing diagram that is characteristic of the current drawn by an example washing machine appliance.

FIG. 6 illustrates example characteristic patterns associated with states of an example washing machine appliance.

Throughout the drawings, same reference numerals indicate similar or corresponding features or functions.

DETAILED DESCRIPTION OF THE INVENTION

Figure 1:
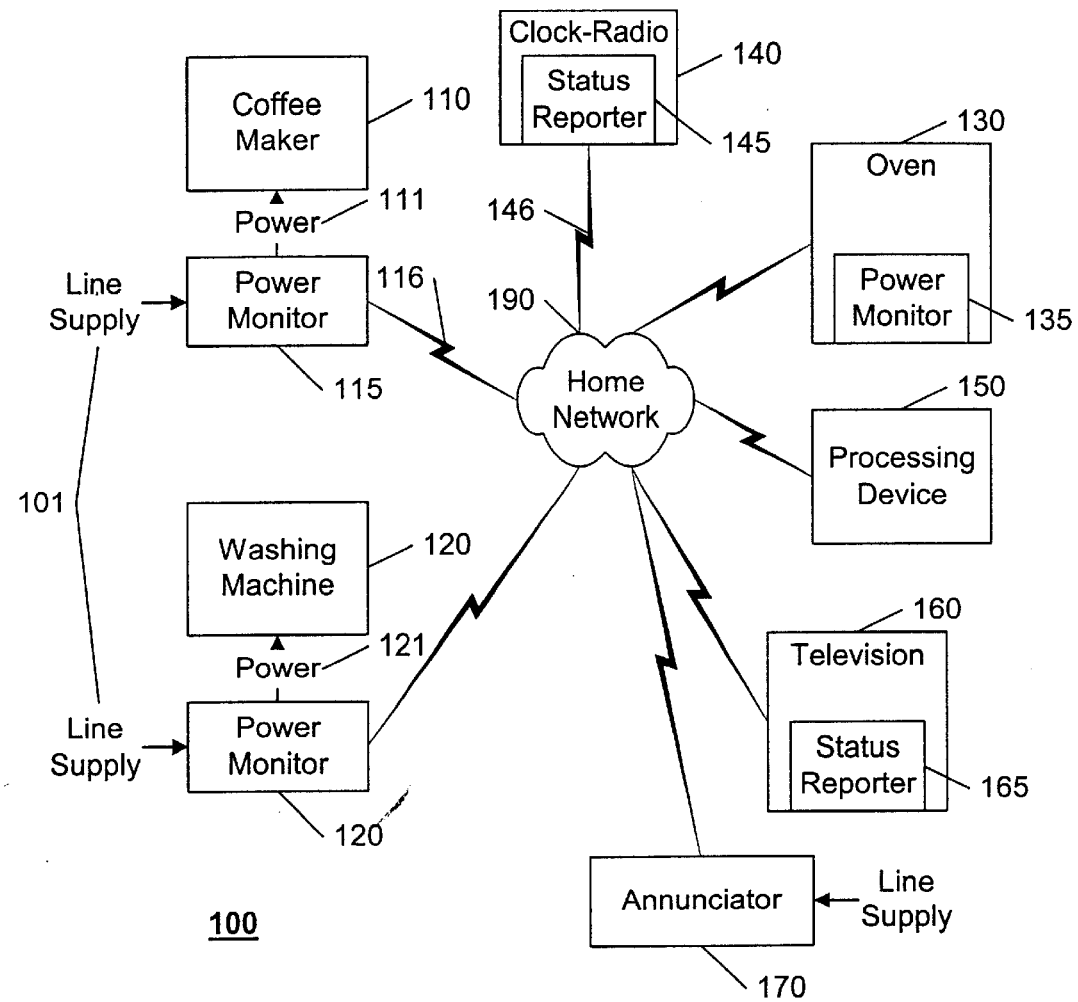
FIG. 1 illustrates an example block diagram of a home-automation system in accordance with this invention.

FIG. 1 illustrates an example block diagram of a home-automation system 100 in accordance with this invention. The home-automation system 100 includes a variety of appliances 110, 120, 130, 140, and 160 and ancillary devices 115, 125, 135, 145, 150, and 170 that facilitate the communication and processing of information and commands related to the appliances 110, 120, 130, 140, and 160 or other systems within a home. For ease of understanding, an appliance is defined herein as a device that has a primary function, such as making coffee, washing clothes, providing entertainment, and the like, that is substantially independent of providing automation information and control.

In accordance with this invention, at least one appliance 110 includes a power monitor device 115 that provides a measure 116 of the power 111 consumed by the appliance 110 to a processing device 150. Based on a sequence of these measures 116, the processing device 150 determines a state of the appliance 110. The processing device 150 also initiates actions based on the determined state of the appliance 10. For example, the processing device 150 may provide a notification signal to the annunciator 170 to notify a user when the coffee maker appliance 110 reaches a "finished brewing" state. Similarly, the processing device 150 may provide a control signal to turn off the coffee maker appliance 110 when the coffee maker appliance 110 reaches a "warming an empty pot" state. Alternatively, the processing device 150 may receive the state 146 of an appliance 140 directly, via a status reporter 145, and effect operations based on a mix of power measures 116 and status reports 146. For example, if the clock-radio appliance 140 reports a "snooze" state 146, the processing device 150 turns on the coffee maker appliance 110, then communicates a command to the clock-radio appliance 140 to terminate the "snooze" state 146 and turn the radio on when the coffee maker appliance 110 reports a "finished brewing" state.

Figure 2:
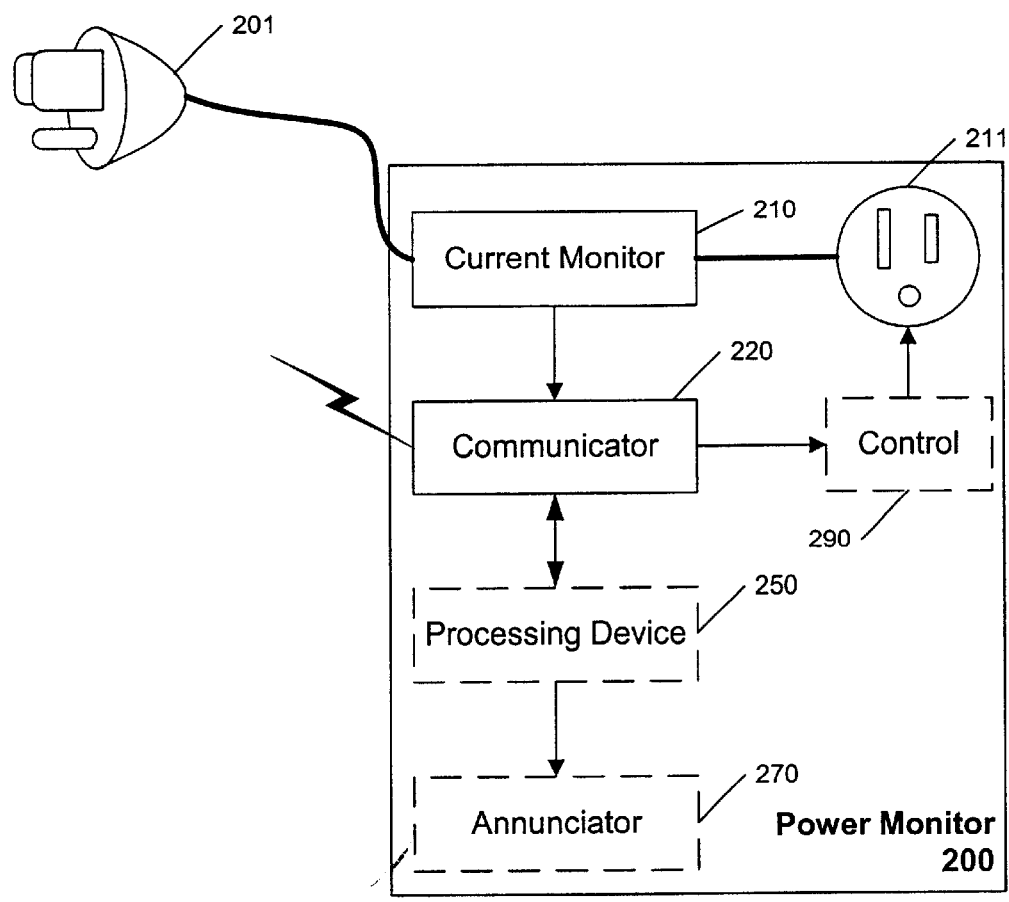
FIG. 2 illustrates an example block diagram of a power monitoring device in accordance with this invention.

FIG. 2 illustrates an example block diagram of a power monitor device 200 that may be used as the power monitor devices 115, 125, 135 in FIG. 1, and, in an alternative embodiment, the status reporter devices 145, 165. In a preferred embodiment, the power monitor device 200 includes a current monitor 210 for measuring the current being drawn by the appliance (not shown), and a communications device 220 for communicating the measure of the current to a processing device, which is typically remote from the power monitor device 200. The power monitor device 200 is illustrated as having a plug 201 for connection to a line supply 101, and a socket 211 for providing power to the appliance, although the socket 211 would not be required when the power monitor 200 is embodied in the appliance, as illustrated in FIG. 1 as power monitor 135 in the oven appliance 130. As illustrated, the power monitor 200 also includes an optional control device 290 for disconnecting the supplied power from the socket 211.

The current monitor 210 utilizes conventional current detection techniques to provide a measure of the current. The current may be detected directly, via an in-line sensor or shunt device, or indirectly, via, for example, an induction coil in proximity to the wire that provides the power to the appliance. The form of the current measure will depend upon the degree of resolution desired or required for determining the state of an appliance. For example, two bits of resolution can be used to signifying one of four possible states: no current flow; minimal current flow; nominal current flow; and high current flow. By providing an indication of multiple power levels appliances may be configured to draw a small but detectable amount of current when turned off and plugged into the monitor 210, so that an "absent" state can be distinguished from an "off" state. In this manner, the monitor 210 may also serve as a security device that alerts the user, or other party, of the removal of a monitored appliance. The particular delineation points among the current measures are fairly arbitrary; in a preferred embodiment, no current flow is less than 0.001 amps, minimal current flow is between 0.001 and 0.1 amps; nominal between 0.1 and 1 amp, and high is above 1 amp. Alternatively, an eight or sixteen bit number may be communicated representing, for example, a measure of the current in milliamps, or, at the other extreme, a single bit may be communicated indicating whether any measurable amount of current is being drawn. These and other techniques for measuring current flow, or power consumption, will be evident to one of ordinary skill in the art.

The communications device 220 communicates the current measure to a processing device that is typically remote from the power monitor device 200. Any number of conventional techniques may be employed to effect this communication, such as via an RF transmission, via a wired connection such as an IEEE RS-232 or IEEE 1394 direct connection, or, in a preferred embodiment, via a communications technique that utilizes the AC supply lines 101 to effect the communications, such as an X-10 compatible device, common in the art of home-automation.

Optionally, the power monitor 200 may include a processing device 250 that effects a similar function as the processing device. 150, and an annunciator 270 that effects a similar function to the annunciator 170. That is, in accordance with this invention, the processing device that determines an appliance's state based on the power measurement may be local 250 to the appliance, or remote 150 from the appliance, and, the annunciator that notifies a user of the status, or change of status, of the appliance, may also be local 270 or remote 170. As illustrated, the optional processing device 250 may communicate the state of the appliance or other messages to the communicator 220, for communication with other devices, such as a remote annunciator 170, or the remote processing device 150.

For ease of reference, the invention will be discussed hereinafter with regard to remote devices 150, 170; the application of the principles presented to the local devices 250, 270 will be evident to one of ordinary skill in the art.

Figure 3:
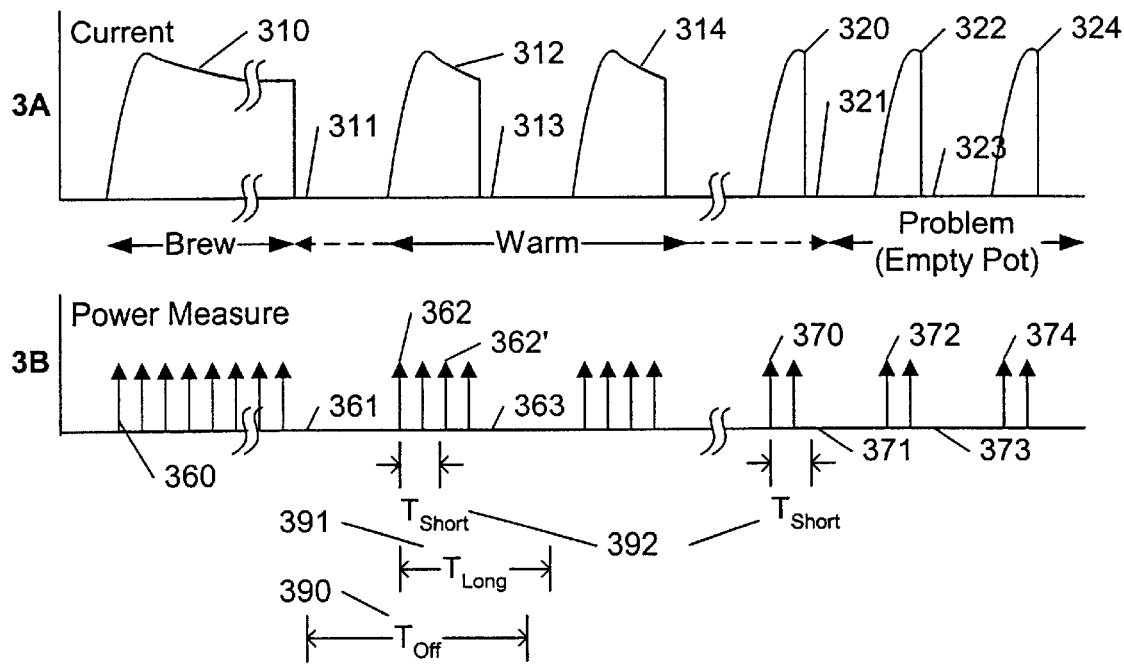
FIG. 3 illustrates an example timing diagram that is characteristic of the current drawn by an example coffee maker appliance.
Figure 4:
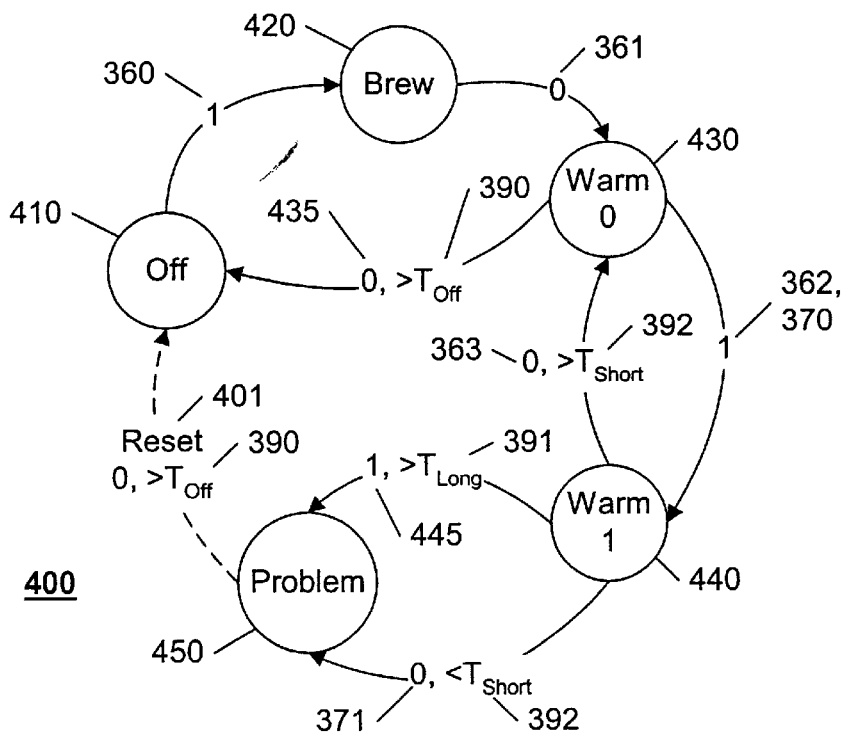
FIG. 4 illustrates an example state diagram that is characteristic of an example coffee maker appliance.

The processing device 150 determines the state of the appliance based on the reported power measurements. In general, the state of the appliance is determined via a sequence of reported power measurements, by comparing the sequence with a set of predetermined sequences corresponding to each state, or each state transition. Any of a variety of techniques, common in the art, may be used to determine a state of an appliance. FIG. 3 illustrates a timing diagram and FIG. 4 illustrates a state diagram for an example coffee maker appliance 110. FIG. 5 illustrates a timing diagram and FIG. 6 illustrates a pattern characterization for an example washing machine appliance 120. Note that the timing diagram patterns are presented for illustrative purposes; specific appliances will exhibit similar or different characteristic patterns.

Line 3A of FIG. 3 illustrates an example characteristic pattern of the current drawn by the coffee maker appliance 110 during a typical usage. During the brewing stage, the appliance 110 draws continuous current 310 until a thermostat or other device in the appliance 110 signals the end of the brewing stage and terminates the current draw, at 311. After some period of time, a thermostat signals a decrease in temperature at the warming plate that holds the coffee pot, and current 312 is again drawn, to keep the coffee warm, then terminated 313, then drawn 314, and so on, in a typical thermostatically controlled cyclic warming process. If an empty, or near empty, coffee pot is on the warming plate, the duration of the thermostatic cycle will decrease, because there is less coffee to heat, and thus less energy is required to raise the temperature of the coffee pot, as illustrated by the shorter current drawing segments 320, 322, 324 of FIG. 3, and corresponding shorter cooling segments 321, 323.

Line 3B of FIG. 3 illustrates a power measurement sampling of the current consumption pattern of Line 3A. In this example, the power measure is a simple on/off measure. The "on" or "drawing current" condition is illustrated in Line 3B as an up-arrow, and the "off" or "insubstantial current" condition is illustrated as the absence of the up-arrow. This representation may correspond, for example, to a system in which, to conserve energy, a power measure is communicated only when power is being drawn by the appliance. As illustrated, the power monitor provides a sequence 360–374 of power measures corresponding to the current drawing pattern 310–324 of the coffee maker appliance 110.

FIG. 4 illustrates an example state diagram 400 for determining a state of the coffee maker appliance 110 based on a sequence of power measures, starting from an initial "off" state 410. The state diagram 400 is an alternative view of the characteristic pattern associated with the operation of a coffee make appliance 110 during typical usage. The example sequence 360–374 is used to demonstrate the operation of the state diagram 400. When the first "on", or "1" power measure 360 is received, the processing device 150 determines that the appliance 110 has entered a brew state 420. The appliance 110 remains in this state 420 until a thermostat or other device in the appliance 110 terminates the current draw, at 311 of FIG. 3. This is signaled by a "off", or "0" power measure 361, that effects a transition to a first "warm" state, warm0 state 430 in FIG. 4. Upon receipt of the next "1" power measure 362, the state is changed from the warm0 state 430 to a second "warm" state; warm1 440; however, if a "1" power measure is not received within a time duration $T_{off}$ 390, the state is changed 435 from warm0 state 430 to the "off" state 410.

In the example presented, a properly operating coffee maker appliance 110 will draw current 312 for at least a time duration $T_{short}$ 392 during the warming stage. A reported "off" state 363 after the time duration $T_{short}$ 392 effects a transition from warm1 state 440 back to the warm0 state 430. The transition from warm0 430, to warm1 440, and back to warm0 430 continues throughout the routine thermostatically controlled warming cycle discussed above. However, if an empty coffee pot is being heated, a short current drawing period 320 results. As illustrated in FIG. 4, if the power measure is reported to be "off" 371 before a time duration $T_{short}$ 392 from the "on" measure 370 that effected the transition into the warm1 440 state, the state is changed from the warm1 440 state to a "problem" state 450. That is, if an empty coffee pot is being heated, the processing device 150 determines a "problem" state 450, based on the reported power measures 370–371 corresponding to the above discussed shortened current draw 320. In like manner, similar to the time duration $T_{shor}$ 392, a time duration $T_{long}$ 391 is defined, such that a continued current draw, indicated by a continued "on" power measure 445 in the warm 1440 state also effects a transition to the "problem" state 450.

Thus, as shown, an information processor 150 of the example system of FIG. 1 can determine when a coffee maker appliance 110 is off, brewing, warming, or exhibiting a problem, based on the sequence of binary power measures 116 (360–374) received from a power monitor 115 associated with the coffee maker appliance 110. In a preferred embodiment of this invention, the information processor 150 effects an action in response to particular states, or state transitions. When the information processor 150 determines that the coffee maker appliance 110 has left the "brew" state 420, it notifies the user that the coffee is ready for consumption. This notification can be effected in a variety of ways, including a spoken message or particular tone sequence via the annunciator 170, or local annunciator 270, a recorded or generated audio or video message via the television 160, and so on. Copending U.S. patent application Ser. No. 09/165, 682 filed Oct. 2, 1998 for Eugene Shteyn for CONTROL PROPERTY IS MAPPED ONTO MODALLY COMPATIBLE GUI ELEMENT, presents a method of mapping messaging onto any object oriented system, such as a home networking system, and is incorporated by reference herein. In a preferred embodiment, the messaging is not necessarily limited to notifications, and may include other effected actions by the information processor 150. For example, when the processing device 150 determines that the coffee maker appliance 110 is in the "problem" state, it communicates a control signal to shut off the appliance 110, using, for example, an optional control device 290 in the power monitor 115 (200), and resets 401 the state diagram 400 of FIG. 4 to the "off" state 410. In like manner, when the processing device 150 determines that the coffee maker appliance 110 has completed the "brew" state, it may communicates a control signal to turn on other appliances, such as the clock radio 140.

FIG. 5 illustrates a example timing diagram for a washing machine appliance 120. FIG. 5 is similar to FIG. 3, except that the power measures 560–576 illustrated in Line 5B are of varying amplitudes, indicating a higher resolution of measure than the binary measures 360–374 of FIG. 3. For example, the current draw 516 for a spin cycle is illustrated on Line 5A as a decreasing function, corresponding to decreasing energy being required to spin the clothing as their water content decreases. Correspondingly, the reported power measure 567 at the end of the spin cycle is illustrated as being less than the power measure 566 at the beginning of the spin cycle. Also note that the reported power measure 567 at the end of the spin cycle is illustrated as being less than the power measure 563 at the end of the wash cycle. In a preferred embodiment of this invention, the processing device 150 utilizes the additional resolution of the provided power measure to distinguish the states of the example washing machine appliance 120.

FIG. 6 illustrates five example characteristic timing diagrams, or patterns 6A–6E, for determining the commencement of each of five states: wash, $1^{st}$ spin, rinse, $2^{nd}$ spin, and finished. Although a conventional state analysis, similar to FIG. 4, may be used to determine the state of the washing machine appliance 120, FIG. 6 is presented as an example alternative method for distinguishing the states of an appliance. Illustrated in pattern 6A, the beginning of the wash state is characterized by an extended "off" period 660, followed by a current draw 662, corresponding to the power measures 560, 562 illustrated on Line 5B of FIG. 5. Pattern 6B represents the commencement of the $1^{st}$ spin state, and is characterized by a substantial current draw 663 followed by little or no current draw for a duration 664, followed by a current draw 666, corresponding to the power measures 563, 564, 566 of FIG. 5, respectively. As is common in the art of pattern recognition, transition periods 605 are ignored in the determination of states based on the amplitude of the reported power measures.

As illustrated in FIG. 6, pattern 6B is very similar to patterns 6C and 6D. The processing device uses the reported power measure amplitudes 663, 667 to distinguish the characteristic pattern 6B of the 1$^{st}$ spin state from the characteristic pattern 6C of the rinse state. In a preferred embodiment, the rinse cycle is characterized as having a large ratio of reported power measure 670 to power measure 667, while the ratio of reported power measure 666 to power measure 663 is relatively small, and is characteristic of the 1$^{st}$ spin cycle.

Measures other than the amplitude of the reported power measure are also used to distinguish states. For example, the 1$^{st}$ spin cycle pattern 6B is distinguished from the 2$^{nd}$ spin cycle pattern 6D by a substantially shorter period 664 of little or no current draw, compared to the period 672 of pattern 6D, corresponding to the periods 514 and 522, respectively, of FIG. 5. In like manner, the finished state pattern 6E is characterized by the absence of a subsequent current draw after an interval 676 from a prior current draw 675.

As would be evident to one of ordinary skill in the art, the techniques discussed above for determining a state based on a sequence of power measures, and other techniques common in the art, can be combined as required to provide the desired level of distinction among states. Note also that the determination of state based on power measures facilitates the development of a monitoring and notification system that can be customized for each user. That is, the definition and determination of each state resides in the embodiment of the processing device 150, rather than being predefined for each appliance. In accordance with this aspect of the invention, the integration of a variety of appliances into a home automation network 190 can be effected without requiring an agreed upon standard of definitions of states among the multitude of vendors that provide the various appliances, and without being constrained by a particular vendor's defined states for an appliance.

In accordance with another aspect of this invention, the rules and characteristics associated with determining a state of an appliance from a sequence of power measures may be provided by an external source, such as a vendor who provides this information as a means for product differentiation, or to increase the perceived value of the appliance. Copending U.S. patent applications Ser. No. 09/160,490 filed Aug. 25, 1998 for Adrian Turner et al., for CUSTOMIZED UPGRADING OF INTERNET-ENABLED DEVICES BASED ON USER-PROFILE, and U.S. Ser. No. 09/189,535 filed Nov. 10, 1998 for Eugene Shteyn for UPGRADING OF SYNERGETIC ASPECTS OF HOME NETWORKS, both incorporated by reference herein, present the upgrading of an appliance by downloading software representative of enhanced versions of the appliance, preferably via the Internet. Copending U.S. patent application Ser. No. 09/311,128 filed May 13, 1999 for Joost Kemink for INTERNET-BASED SERVICE FOR UPDATING A PROGRAMMABLE CONTROL DEVICE, incorporated by reference herein, presents the updating of a programmable control device to facilitate the control of the appliance, also via the Internet. Using techniques similar to those presented in these referenced applications, the processing device 150 can receive the information and programming required to effect the determination of states for selected appliances.

Figure 7:
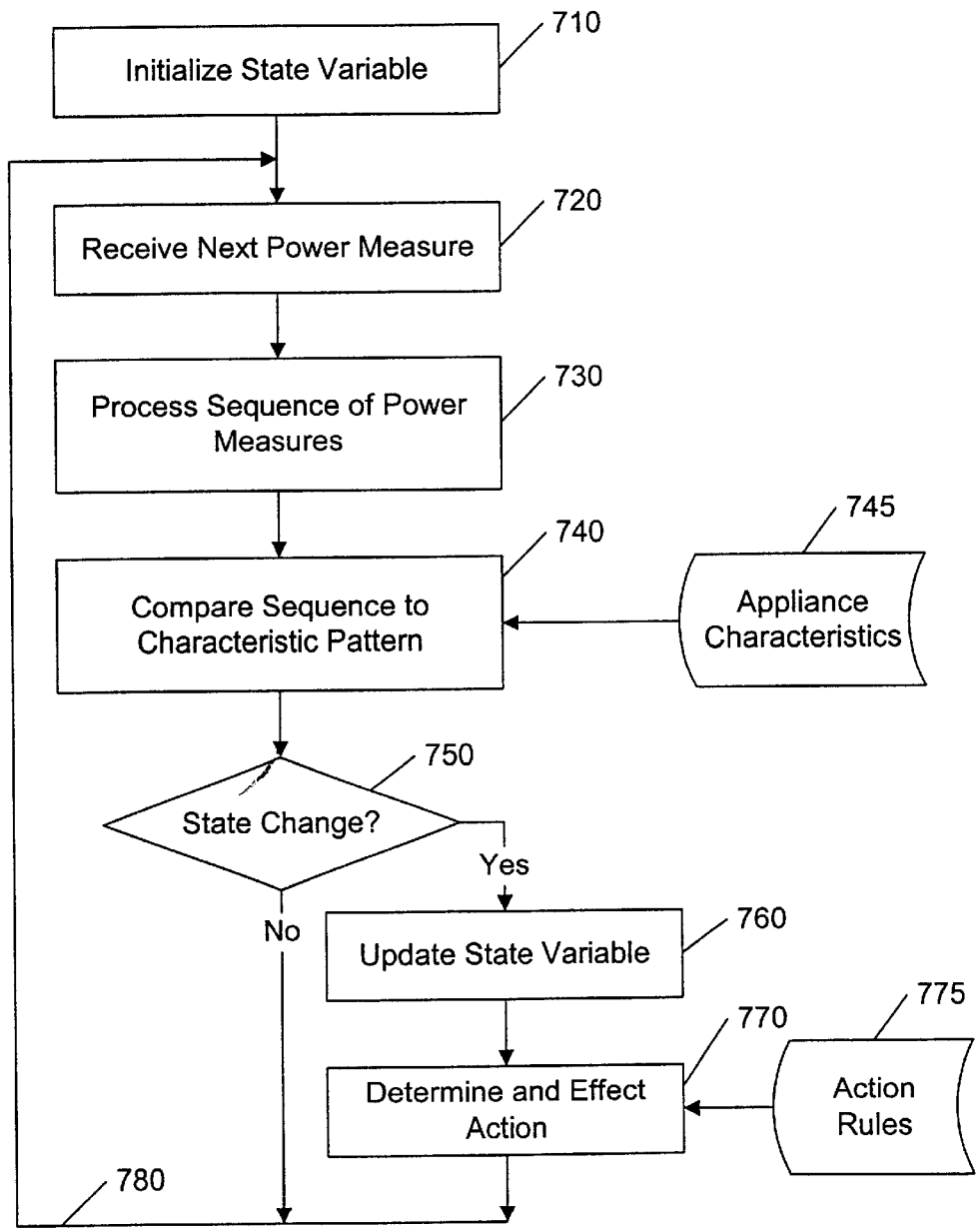
FIG. 7 illustrates an example flow diagram for a processing device in accordance with this invention.

FIG. 7 illustrates an example flow diagram for a processing device 150 in accordance with this invention. At 710, the state variable is initialized, typically to an "off" state. Each reported power measure is received, at 720. For ease of reference, FIG. 7 illustrates the processing of reports from a single appliance. In a preferred embodiment of this invention, the reported power measure will have an associated source address that is used to determine the appliance associated with the reported power measure. The reported power measure is processed to create a sequence of prior power measures 730. As is common in the art, the processing of the measure may include scaling to provide a normalized measure that facilitates the subsequent comparison, at 740, with the appliance characteristics. Other conversions may also be effected at the processing block 730. For example, the power measure may be reported as an eight-bit number, while the appliance, such as the example coffee maker appliance 110, may only require a one-bit binary value to determine its state. The length of the sequence is determined by the characteristics of the appliance. A simple on/off state determination, for example, only requires a sequence of one power measure, whereas the example washing machine appliance 120 discussed above requires a longer sequence, to distinguish, for example, between example characteristic patterns 6B and 6D in FIG. 6. Note that, as is common in the art, any one of a variety of techniques may be used to assemble the sequence. For example, a time-since-last-change parameter may be utilized, rather than a sequence of repetitive measures, or, as is common in state table processing, a recording of the prior state and the new input measure is a sufficient representation of a sequence.

The processed sequence is compared to the characteristic 745 associated with the appliance, at 740. As discussed above, the form of the characteristics 745 can be any of a variety of forms that facilitate a determination of the state of the appliance from the reported sequence. For example, the characteristics 745 of the coffee maker appliance 110 may be in the form of a state machine that effects the state transitions illustrated in FIG. 4. Conversely, the characteristics 745 of the washing machine appliance 120 may be in the form of graphic patterns, and the comparison block 740 is configured as a pattern matching system. These and other forms of information processing techniques to facilitate comparisons will be evident to one of ordinary skill in the art in view of this disclosure.

If, at 750, the comparison at 740 indicates a change of state, the state variable is updated, at 760. At 770, the appropriate action, if any, corresponding to this change of state is determined, and effected, typically by communicating a message to another device, such as the annunciator 170, another appliance, such as the television appliance 160, or to the appliance corresponding to the reported power measures, such as the coffee pot appliance 110. FIG. 7 illustrates a typical state-transition driven process, wherein actions are effected only when the appliance undergoes a change of state. As is evident to one of ordinary skill in the art, placing the block 770 outside the conditional path, for example, at 780, will provide for effecting actions with every reported power measure. Alternatively, forming the block 770 as a process that is independent of the flow of FIG. 7 will provide for a continuous determination of actions, and would be useful, for example, to detect an absence of the power monitor device. In a preferred embodiment, the actions are determined via a collection of rules 775 associated with the appliance. As with the characteristics 745, the rules 775 may be any of a variety of forms. In a preferred embodiment, the rules are conventional IF-THEN-ELSE statements, common in the art of programming. For example, a rule for the coffee pot appliance 110 may be "IF new state=warm THEN send Message1 to Annunciator3", where Message1 is a recorded or generated message corresponding to the coffee being ready, and Annunciator3 is an identification of one or more devices or appliances that are used to render the message to notify the user. After effecting whatever actions are required, the process continues, via the loop back to block 720 to receive the next power measure.

The foregoing merely illustrates the principles of the invention. It will thus be appreciated that those skilled in the art will be able to devise various arrangements which, although not explicitly described or shown herein, embody the principles of the invention and are thus within its spirit and scope. For example, the system of FIG. 1 is illustrated as having a single processing device 150. Co-pending U.S. patent application Ser. No. 09/222,403 filed Dec. 29, 1998 for Doreen Cheng for HOME CONTROL SYSTEM WITH DISTRIBUTED, NETWORKED DEVICES, presents a distributed network of processing devices, and is incorporated by reference herein.

The particular configurations and structures are presented in the figures for illustration purposes. Alternative arrangements are feasible as well. For example, the processing device 150 is illustrated as being connected directly to the home network 190. An alternative arrangement could include a processing device 150 that is remote from the home, such as a service provided by a security monitoring agency, that is connected via a telephone or cable network. In like manner, an annunciation device 170 may be located at a remote location, and used to provide security alert notifications when monitored appliances are reported as being absent, or when the monitor unexpectedly ceases transmission. These and other system configuration and optimization features will be evident to one of ordinary skill in the art in view of this disclosure, and are included within the scope of the following claims.

I claim:

1. An information processing system, comprising:
   a monitor device that provides a sequence of power measures corresponding to a power consumption of an appliance,
   a processing device that among a plurality of states of the operation cycles determines a state of the appliance based on the sequence of power measures; and,
   a communications device that communicates the sequence of power measures from the monitor device to the processing device.

2. The information processing system of claim 1, wherein the communications device communicates the sequence of power measures via a power line circuit.

3. The information processing system of claim 1, further including:
   a notification device that notifies a user of a change of the state of the appliance.

4. The information processing system of claim 3, wherein the processing device communicates the change of the state of the appliance to the notification device via a power line circuit.

5. The information processing system of claim 1, further including
   a home network that includes at least one audio device, and
   wherein
   the processing device notifies a user of a change of the state of the appliance via the at least one audio device of the home network.

6. The information processing system of claim 1, further including
   a home network that includes at least one display device that presents a visual signal, and
   wherein
   the processing device notifies a user of a change of the state of the appliance via the at least one display device of the home network.

7. The information processing system of claim 1, further including
   a control device that controls the state of the appliance, and
   wherein
   the processing device communicates with the control device to effect a change in the state of the appliance.

8. The information processing system of claim 1, further including
   a control device that controls an other appliance, and
   wherein
   the processing device communicates with the control device to effect a control of the other appliance.

9. The information processing system of claim 1, wherein
   the processing device determines the state of the appliance in dependence upon a characteristic pattern associated with the appliance.

10. The information processing system of claim 9, wherein
    the characteristic pattern is provided via an Internet site.

11. The information processing system of claim 1, wherein
    the processing device determines an action to be effected based on a rule associated with the appliance that includes the state of the appliance.

12. The information processing system of claim 11, wherein
    the rule is provided via an Internet site.

13. A monitoring device comprising:
    a sensing device that provides a sequence of power measures corresponding to a power consumption of the appliance,
    a processing device that determines a state among a plurality of states of the operation cycles of the appliance based on the sequence of power measures, and,
    a notification device that notifies a user of a change of the state of the appliance.

14. The monitoring device of claim 13, further including
    a communications device that communicates the state of the appliance to a home network for an alternative notification of the user of the change of the state of the appliance.

15. The monitoring device of claim 13, further including
    a control device that controls the state of the appliance.

16. The monitoring device of claim 13, further including
    a control device that terminates the power consumption of the appliance.

17. A method for determining a state among a plurality of states of the operation cycles of an appliance, comprising:
    collecting a sequence of power consumption measures,
    comparing the sequence of power consumption measures to a characteristic pattern of power consumption associated with at least one predetermined state of the appliance, and determining thereby the state of the appliance.

18. The method of claim 17, further including
    notifying a user of the state of the appliance.

19. The method of claim 18, further including
    communicating a notification signal to a notification device for notifying the user.

20. The method of claim 17, further including communicating the sequence of power consumption measures to a processing device for determining the state of the appliance based on the sequence of power consumption measures.

21. The method of claim 17, further including downloading the characteristic pattern from an Internet site.

22. The method of claim 17, further including effecting an action based on a rule that is associated with the state of the appliance.

23. The method of claim 22, further including downloading the rule from an Internet site.

* * * * *